United States Patent

Song

(10) Patent No.: US 10,541,351 B2
(45) Date of Patent: Jan. 21, 2020

(54) LIGHT EMITTING DIODE HAVING A CURRENT BLOCKING LAYER

(71) Applicant: LG INNOTEK CO., LTD., Seoul (KR)

(72) Inventor: Hyun Don Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 20 days.

(21) Appl. No.: 16/068,557

(22) PCT Filed: Jan. 6, 2017

(86) PCT No.: PCT/KR2017/000179
§ 371 (c)(1),
(2) Date: Jul. 6, 2018

(87) PCT Pub. No.: WO2017/119754
PCT Pub. Date: Jul. 13, 2017

(65) Prior Publication Data
US 2019/0027647 A1 Jan. 24, 2019

(30) Foreign Application Priority Data
Jan. 7, 2016 (KR) .................. 10-2016-0001833

(51) Int. Cl.
*H01L 33/14* (2010.01)
*H01L 33/32* (2010.01)
(Continued)

(52) U.S. Cl.
CPC ............ *H01L 33/145* (2013.01); *H01L 33/32* (2013.01); *H01L 33/36* (2013.01); *H01L 33/62* (2013.01)

(58) Field of Classification Search
CPC ....... H01L 33/10; H01L 33/14; H01L 33/145; H01L 33/38
See application file for complete search history.

(56) References Cited

U.S. PATENT DOCUMENTS

| 5,376,580 A | 12/1994 | Kish et al. |
| 2002/0190260 A1 | 12/2002 | Shen et al. |

(Continued)

FOREIGN PATENT DOCUMENTS

| EP | 0 616 376 | 9/1994 |
| EP | 2 403 025 | 1/2012 |

(Continued)

OTHER PUBLICATIONS

International Search Report (with English Translation) and Written Opinion dated Mar. 30, 2017 issued in Application No. PCT/KR2017/000179.

(Continued)

*Primary Examiner* — Hoai V Pham
(74) *Attorney, Agent, or Firm* — KED & Associates, LLP

(57) ABSTRACT

A light emitting device according to embodiments includes a substrate, a light emitting structure disposed under the substrate and including a first conductive semiconductor layer, an active layer, and a second conductive semiconductor layer, a submount disposed to face the substrate, first and second metal pads disposed on the submount to be spaced apart from each other, a first bump disposed on the first metal pad, a plurality of second bumps disposed on the second metal pad to be spaced apart from each other, a first ohmic layer interposed between the first conductive semiconductor layer and the first bump, a second ohmic layer interposed between the second conductive semiconductor layer and the plurality of second bumps, a first spreading layer interposed between the first ohmic layer and the first bump, a second spreading layer interposed between the second ohmic layer and the plurality of second bumps, and a current blocking layer disposed in a maximum heating area of the second ohmic layer overlapping an area between the plurality of second bumps in a thickness direction of the (Continued)

light emitting structure such that the current blocking layer does not cut the second ohmic layer in a horizontal direction intersecting the thickness direction.

19 Claims, 11 Drawing Sheets

(51) Int. Cl.
*H01L 33/62* (2010.01)
*H01L 33/36* (2010.01)

(56) References Cited

U.S. PATENT DOCUMENTS

2006/0081869 A1 4/2006 Lu et al.
2011/0220937 A1* 9/2011 Jeong ................. H01L 33/22
257/98
2011/0297989 A1 12/2011 Murai et al.

FOREIGN PATENT DOCUMENTS

| | | |
|---|---|---|
| JP | 2006-147630 | 6/2006 |
| JP | 2012-064759 | 3/2012 |
| KR | 10-2006-0054089 | 5/2006 |
| KR | 10-2015-0054357 | 5/2015 |
| KR | 10-2015-0146161 | 12/2015 |
| KR | 10-2016-0047766 | 5/2016 |

OTHER PUBLICATIONS

European Search Report dated Jan. 24, 2019 issued in Application No. 17736126.8.

* cited by examiner

LIGHT EMITTING DIODE HAVING A CURRENT BLOCKING LAYER

CROSS-REFERENCE TO RELATED PATENT APPLICATIONS

This application is a U.S. National Stage Application under 35 U.S.C. § 371 of PCT Application No. PCT/KR2017/000179, filed Jan. 6, 2017, which claims priority to Korean Patent Application No. 10-2016-0001833, filed Jan. 7, 2016, whose entire disclosures are hereby incorporated by reference.

TECHNICAL FIELD

The present invention relates to a light emitting device.

BACKGROUND ART

A light emitting diode (LED) is a kind of semiconductor that converts electricity into infrared light or light used for receiving or transmitting signals or used as a light source by utilizing properties of a compound semiconductor.

Group III-V nitride semiconductors have been in the spotlight as important materials of light emitting devices such as an LED or laser diode (LD) due to physical and chemical properties thereof.

Since LEDs do not contain environmentally hazardous substances such as mercury (Hg), which is used in conventional lighting devices such as incandescent lamps and fluorescent lamps, the LEDs have high environment friendly properties, and since the LEDs have advantages of a prolonged lifetime, low power consumption properties, and the like, the LEDs have been replacing conventional light sources.

In the case of the above-described light emitting device and a light emitting device package including the same, since a path through which carriers are supplied and a path through which heat is radiated are the same, a thermal degradation phenomenon, in which it is difficult for heat to radiate to the outside, may occur. Particularly, in a case in which the light emitting device emits deep ultraviolet light, a heat loss rate may be further increased due to a high driving voltage.

DISCLOSURE

Technical Problem

The present invention is directed to providing a light emitting device having improved reliability.

Technical Solution

One aspect of the present invention provides a light emitting device including: a substrate; a light emitting structure disposed under the substrate and including a first conductive semiconductor layer, an active layer, and a second conductive semiconductor layer; a submount disposed to face the substrate; first and second metal pads disposed on the submount to be spaced apart from each other; a first bump disposed on the first metal pad; a plurality of second bumps disposed on the second metal pad to be spaced apart from each other; a first ohmic layer interposed between the first conductive semiconductor layer and the first bump; a second ohmic layer interposed between the second conductive semiconductor layer and the plurality of second bumps; a first spreading layer interposed between the first ohmic layer and the first bump; a second spreading layer interposed between the second ohmic layer and the plurality of second bumps; and a current blocking layer disposed in a maximum heating area of the second ohmic layer overlapping an area between the plurality of second bumps in a thickness direction of the light emitting structure such that the current blocking layer does not cut the second ohmic layer in a horizontal direction intersecting the thickness direction.

The second ohmic layer may include: a first region corresponding to the maximum heating area; and a second region adjacent to the first region in the horizontal direction intersecting the thickness direction of the light emitting structure.

The current blocking layer may be disposed to extend from the first region to the second region.

The current blocking layer may include a first segment disposed in the first region which is the maximum heating area. The current blocking layer may further include a second segment extending from the first segment to the second region and overlapping the plurality of second bumps in the thickness direction of the light emitting structure.

A width of the current blocking layer may be greater than or equal to that of the maximum heating area.

The current blocking layer may include a first surface in contact with the second conductive semiconductor layer; and a second surface facing the second spreading layer in the thickness direction of the light emitting structure and disposed to be opposite the first surface.

The second ohmic layer may include a light-transmitting conductive material, and a shortest distance from the second surface of the current blocking layer to the second spreading layer may range from 1 nm to 10 nm. Alternatively, the second ohmic layer may include a metal material, and a shortest distance from the second surface of the current blocking layer to the second spreading layer may be 200 nm or more.

A width of the first segment may range from 10 μm to 90 μm, and a width of the second segment may range from 5 μm to 25 μm. The width the second segment may be 15 μm.

The current blocking layer may include air or a material in Schottky contact with the second conductive semiconductor layer, or may be formed due to plasma damage. In the case in which the current blocking layer is formed due to the plasma damage, the current blocking layer may include at least one from argon, fluorine, and oxygen atoms. Alternatively, the current blocking layer may include an insulating material.

The active layer may emit light of a deep ultraviolet wavelength band.

The current blocking layer may include a plurality of current blocking layers formed between the plurality of second bumps and disposed in the horizontal direction. The plurality of current blocking layers may be disposed to be spaced an equidistance from each other. Horizontal widths of the plurality of current blocking layers may be equal.

Another aspect of the present invention provides a light emitting device including: a substrate and a submount disposed to face each other; a plurality of metal pads disposed on the submount to be spaced apart from each other; a light emitting structure interposed between the substrate and the submount; a plurality of bumps interposed between the light emitting structure and the plurality of metal pads; an electrode layer interposed between the light emitting structure and the plurality of bumps; and a current blocking layer disposed at a maximum heating area of the electrode layer overlapping an area between the plurality of bumps in a thickness direction of the light emitting structure such that the current blocking layer does not cut the electrode layer in a direction intersecting the thickness direction.

The electrode layer may include: an ohmic layer interposed between the light emitting structure and the plurality of bumps; and a spreading layer interposed between the ohmic layer and the plurality of bumps, wherein the current blocking layer may be disposed in the ohmic layer.

The light emitting structure may include: a first conductive semiconductor layer disposed under the substrate; an active layer disposed under the first conductive semiconductor layer; and a second conductive semiconductor layer disposed under the active layer.

The ohmic layer may include first and second ohmic layers, the spreading layer includes first and second spreading layers, and the plurality of metal pads include first and second metal pads, the plurality of bumps may include a first bump disposed between the first spreading layer and the first metal pad, and a plurality of second bumps interposed between the second spreading layer and the second metal pad, and the current blocking layer may be disposed at the maximum heating area located in the second ohmic layer.

The current blocking layer may be disposed to extend from the maximum heating area to a region overlapping the plurality of second bumps in the thickness direction.

Advantageous Effects

A light emitting device and a light emitting device package including the same according to embodiments have improved reliability in which a thermal degradation phenomenon can be prevented by a current blocking layer disposed in an ohmic layer, a prolonged lifetime can be achieved by improving a heat loss rate even at a high driving voltage, and the like.

MODES OF THE INVENTION

Hereinafter, embodiments will be described in detail to specifically describe the present invention with reference to the accompanying drawings to facilitating understanding about the present invention. However, the embodiments of the present invention may be modified into various forms and, it should not be interpreted that the scope of the present invention is not limited to the embodiments which will be described below. The embodiments of the present invention are provided to more completely explain the present invention to those having average skill in the art.

In the description of the embodiments of the present invention, when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

In addition, the relative terms such as "first" and "second," "on/upper/above" and "below/lower/under," and the like may be used to distinguish any one object or element from another object or element while not necessary requiring or indicating a physical or logical relation or order between the objects or elements.

Figure 1:
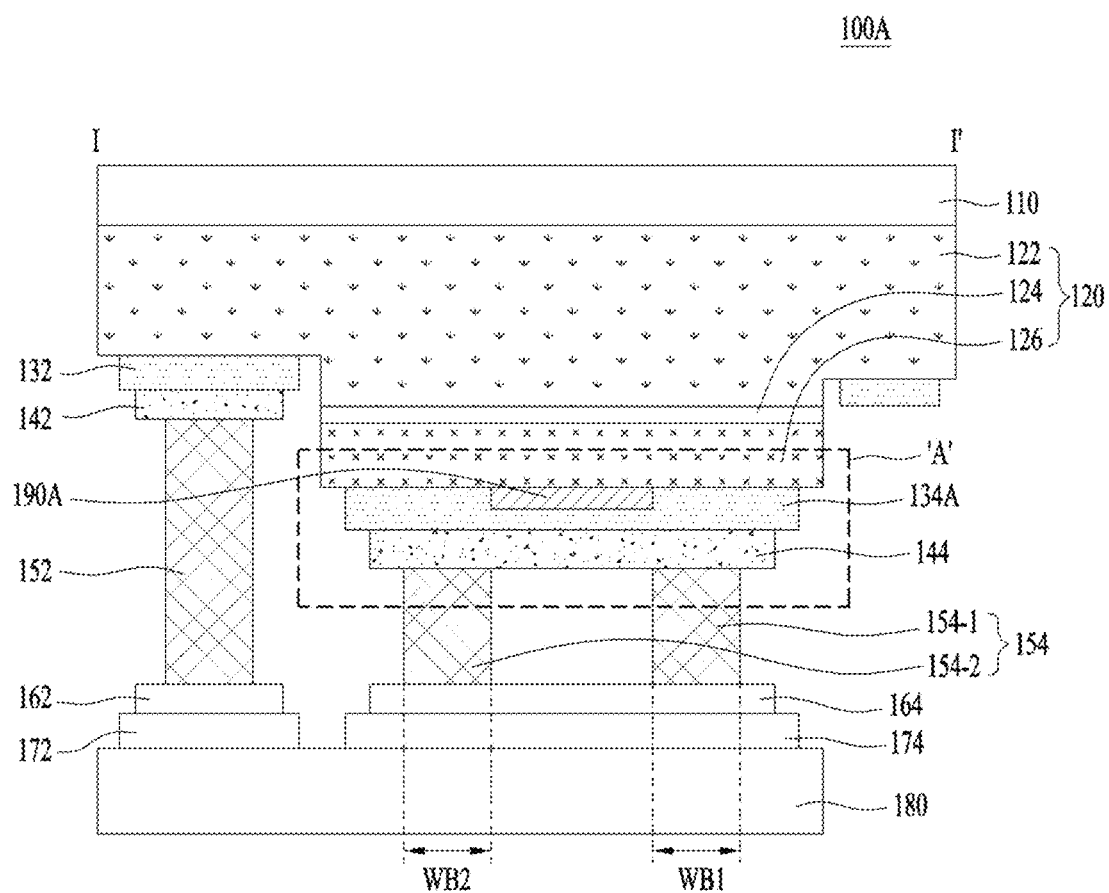
FIG. 1 is a cross-sectional view illustrating a light emitting device according to a first embodiment.
Figure 2:
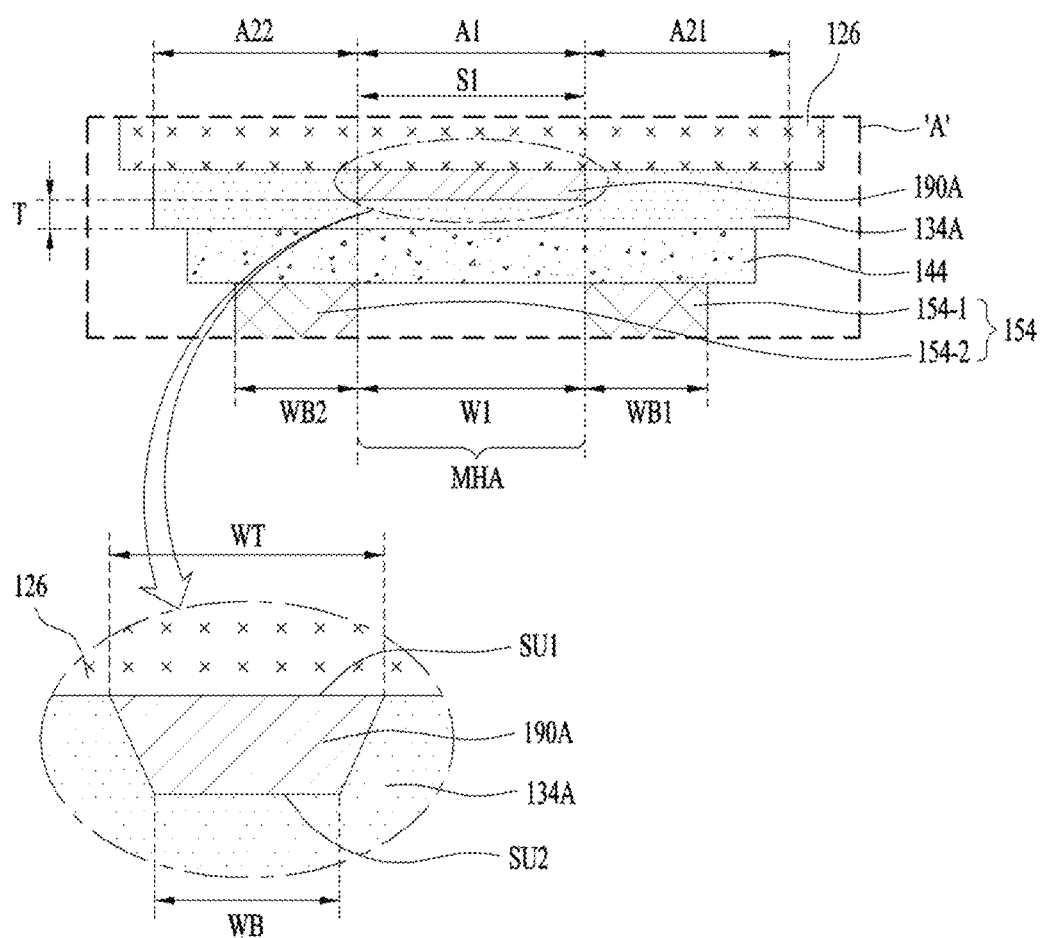
FIG. 2 is an enlarged cross-sectional view illustrating a portion 'A' illustrated in FIG. 1.
Figure 3:
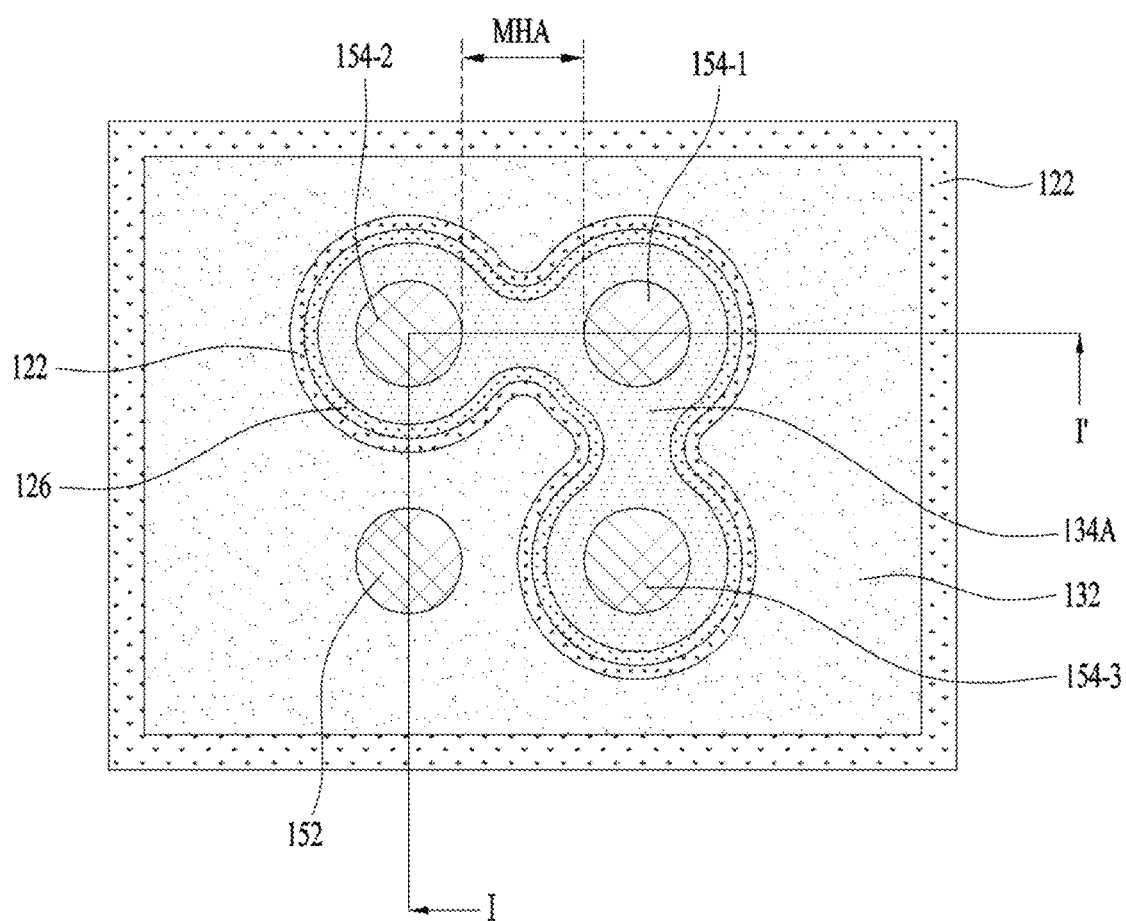
FIG. 3 is a bottom view illustrating an example of the light emitting device illustrated in FIG. 1.

FIG. 1 is a cross-sectional view illustrating a light emitting device 100A according to a first embodiment, FIG. 2 is an enlarged cross-sectional view illustrating a portion 'A' illustrated in FIG. 1, and FIG. 3 is a bottom view illustrating an example of the light emitting device 100A illustrated in FIG. 1.

Although FIG. 1 corresponds to a cross-sectional view taken along line I-I' illustrated in FIG. 3, the embodiment is not limited thereto. That is, the light emitting device 100A illustrated in FIG. 1 may also have various bottom views other than the bottom view illustrated in FIG. 3.

The light emitting device 100A illustrated in FIG. 1 may include a substrate 110, a light emitting structure 120, first and second ohmic layers (or contact layers or electrodes) 132 and 134A, first and second spreading layers 142 and 144, at least one first bump 152, a plurality of second bumps 154, first and second metal pads 162 and 164, first and second insulating layers 172 and 174, a submount 180, and a current blocking layer (or non-ohmic layer) 190A.

The first and second spreading layers 142 and 144, the first and second metal pads 162 and 164, the first and second insulating layers 172 and 174, and the submount 180 illustrated in FIG. 1 are omitted in FIG. 3. FIG. 3 corresponds to the bottom view illustrating the light emitting device 100A which is illustrated in FIG. 1 and as seen from the submount 180 toward the light emitting structure 120.

The substrate 110 may include a conductive material or non-conductive material. For example, the substrate 110 may include at least one from sapphire ($Al_2O_3$), GaN, SiC, ZnO, GaP, InP, $Ga_2O_3$, GaAs, and Si, but the embodiment is not limited to the above materials of the substrate 110.

To improve discrepancies in coefficient of thermal expansion (CTE) and lattice mismatch between the substrate 110 and the light emitting structure 120, a buffer layer (or transition layer, not shown) may also be further interposed between the substrate 110 and the light emitting structure 120. For example, the buffer layer may include at least one material selected from the group consisting of Al, In, N, and Ga, but is not limited thereto. In addition, the buffer layer may have a single-layer or multi-layer structure.

The light emitting structure 120 is disposed under the substrate 110. That is, the substrate 110 and the submount 180 are disposed to face each other, and the light emitting structure 120 may be interposed between the substrate 110 and the submount 180.

The light emitting structure 120 may include a first conductive semiconductor layer 122, an active layer 124, and a second conductive semiconductor layer 126.

The first conductive semiconductor layer 122 is disposed under the substrate 110. The first conductive semiconductor layer 122 may be formed of group III-V or II-VI compound semiconductor or the like doped with a first conductive dopant. In a case in which the first conductive semiconductor layer 122 is an N-type semiconductor layer, the first conductive dopant may be an N-type dopant and may include Si, Ge, Sn, Se, or Te, but is not limited thereto.

For example, the first conductive semiconductor layer 122 may include a semiconductor material having a composition formula of $Al_xIn_yGa_{(1-x-y)}N$ ($0 \leq x \leq 1$, $0 \leq y \leq 1$, and $0 \leq x+y \leq 1$). The first conductive semiconductor layer 122 may include at least one from GaN, InN, AlN, InGaN, AlGaN, InAlGaN, AlInN, AlGaAs, InGaAs, AlInGaAs, GaP, AlGaP, InGaP, AlInGaP, and InP.

The active layer 124 is interposed between the first conductive semiconductor layer 122 and the second conductive semiconductor layer 126, and is a layer in which electrons (or holes) injected through the first conductive semiconductor layer 122 meet holes (or electrons) injected through the second conductive semiconductor layer 126 and which emits light having energy determined by an inherent energy band of a material forming the active layer 124. The active layer 124 may have one of a single well structure, a multi well structure, a multi quantum well (MQW) structure, a quantum-wire structure, and a quantum dot structure.

A well layer/blocking layer of the active layer 124 may have a pair structure of any one or more from InGaN/GaN, InGaN/InGaN, GaN/AlGaN, InAlGaN/GaN, GaAs(InGaAs)/AlGaAs, and GaP(InGaP)/AlGaP, but is not limited thereto. The well layer may be formed of a material having lower band gap energy than the blocking layer.

A conductive clad layer (not shown) may be formed above and/or under the active layer 124. The conductive clad layer may be formed of a semiconductor having higher band gap energy than the blocking layer of the active layer 124. For example, the conductive clad layer may include a GaN, AlGaN, InAlGaN, super lattice structure, or the like. In addition, the conductive clad layer may be doped with an N-type or P-type dopant.

According to the embodiment, the active layer 124 may emit light in an ultraviolet wavelength band. Here, the ultraviolet wavelength band may be a wavelength band ranging from 100 nm to 400 nm. Particularly, the active layer 124 may emit light in a deep ultraviolet wavelength band ranging from 100 nm to 280 nm. However, the embodiment is not limited to the wavelength band of light emitted by the active layer 124.

The second conductive semiconductor layer 126 may be disposed under the active layer 124 and formed of a compound semiconductor. The second conductive semiconductor layer 126 may be formed of a group III-V or II-VI compound semiconductor, or the like. For example, the second conductive semiconductor layer 126 may include a semiconductor material having a composition formula of $In_xAl_yGa_{(1-x-y)}N$ ($0 \leq x \leq 1$, $0 \leq y \leq 1$, and $0 \leq x+y \leq 1$). The second conductive semiconductor layer 126 may be doped with a second conductive dopant. In a case in which the second conductive semiconductor layer 126 is a P-type semiconductor layer, the second conductive dopant may include Mg, Zn, Ca, Sr, Ba, or the like as the P-type dopant.

The first conductive semiconductor layer 122 may be formed as an N-type semiconductor layer, and the second conductive semiconductor layer 126 may be formed as a P-type semiconductor layer. Alternatively, the first conductive semiconductor layer 122 may also be formed as a P-type semiconductor layer, and the second conductive semiconductor layer 126 may also be formed as an N-type semiconductor layer.

The light emitting structure 120 may be formed to have any one structure from an n-p junction structure, a p-n junction structure, an n-p-n junction structure, and a p-n-p junction structure.

Since the light emitting device 100A illustrated in FIGS. 1 to 3 has a flip chip bonding structure, light emitted from the active layer 124 may be emitted through the first ohmic layer 132, the first conductive semiconductor layer 122, and the substrate 110. To this end, the first ohmic layer 132, the first conductive semiconductor layer 122, and the substrate 110 may be formed of a material having a light transmission property. Here, the second conductive semiconductor layer 126 and the second ohmic layer 134 may be formed of a material having a light transmission, opaqueness, or reflective property, but the embodiment may not be limited to a specific material.

The submount 180 may be disposed to face the substrate 110. That is, the submount 180 may be disposed under the substrate 110. The submount 180 may be formed of a semiconductor substrate including, for example, AlN, BN, silicon carbide (SiC), GaN, GaAs, or Si, but may be not limited thereto, and may also be formed of a semiconductor material having high thermal conductivity. In addition, the submount 180 may also include a Zener diode type element for preventing electro static discharge (ESD).

A plurality of metal pads may be disposed above the submount 180. As illustrated in FIG. 1, the plurality of metal pads may include the first and second metal pads 162 and 164. The first and second metal pads 162 and 164 may be disposed above the submount 180 and may be electrically separated. Each of the first and second metal pads 162 and 164 may be formed of an electrically conductive metal material.

The first and second insulating layers 172 and 174 are interposed between the first and second metal pads 162 and 164 and the submount, respectively. In a case in which the submount 180 is formed of an electrically conductive material such as Si, the first and second insulating layers 172 and 174 may be disposed to electrically insulate the first and second metal pads 162 and 164 from the submount 180. Here, the first and second insulating layers 172 and 174 may include an electrical insulation material. In addition, the first and second insulating layers 172 and 174 may also be formed of a material having a light reflective property as well as an electrical insulation property.

For example, each of the first and second insulating layers 172 and 174 may include a distributed Bragg reflector (DBR) layer. In this case, the DBR layer may serve an insulating function and may also serve a reflective function. The DBR layer may have a structure in which a first layer and a second layer which have different refractivity are alternately stacked at least one time. Each of the DBR layers may be an electrical insulation material. For example, the first layer may be a first dielectric layer such as $TiO_2$, and the second layer may include a second dielectric layer such as $SiO_2$. For example, the DBR layer may have a structure in which the $TiO_2/SiO_2$ layers are stacked at least one time. A thickness of each of the first layer and the second layer may be $\lambda/4$, wherein $\lambda$ may be a wavelength of light generated by a light emitting cell.

In addition, each of the first and second insulating layers 172 and 174 may include at least one from $SiO_2$, $TiO_2$, $ZrO_2$, $Si_3N_4$, $Al_2O_3$, and $MgF_2$, but the embodiment is not limited thereto. In a case in which the submount 180 is formed of an electrical insulation material, the first and second insulating layers 172 and 174 may be omitted.

A plurality of bumps may be interposed between the light emitting structure 120 and the plurality of metal pads. Here, the plurality of bumps may include the first bump 152 and the plurality of second bumps 154. The first bump 152 may be interposed between the light emitting structure 120 and the first metal pad 162, and the plurality of second bumps 154 may be interposed between the light emitting structure 120 and the second metal pad 164.

The first bump 152 may be interposed between the first metal pad 162 and the first spreading layer 142. The number of first bumps 152 may be one as illustrated in FIG. 1, but the embodiment is not limited thereto.

The plurality of second bumps 154 may be interposed between the second metal pad 164 and the second spreading layer 144. The number of the plurality of second bumps 154 may be two as illustrated in FIG. 1 or three as illustrated in FIG. 3, but the embodiment is not limited thereto. That is, the plurality of second bumps 154 may include a second-first bump 154-1, a second-second bump 154-2, and a second-third bump 154-3 which are electrically and spatially separated.

Electrode layers may be interposed between the light emitting structure 120 and the plurality of bumps. That is, the electrode layers may include the ohmic layers and the spreading layers. The electrode layers may include first and second electrode layers. The ohmic layers interposed between the light emitting structure 120 and the plurality of bumps may include the first and second ohmic layers 132 and 134A, and the spreading layers disposed between the ohmic layers and the plurality of bumps may include the first and second spreading layers 142 and 144. The first electrode layer may include the first ohmic layer 132 and the first spreading layer 142, and the second electrode layer may include the second ohmic layer 134A and the second spreading layer 144.

The first ohmic layer 132 may be interposed between the light emitting structure 120 and the first bump 152, and the second ohmic layer 134A may be interposed between the light emitting structure 120 and the plurality of second bump 154.

The first ohmic layer 132 may be disposed under the first conductive semiconductor layer 122 exposed through a mesa etching process, and electrically connected to the first bump 152 through the first spreading layer 142. That is, the first ohmic layer 132 may be interposed between the first bump 152 and the first conductive semiconductor layer 122. In addition, the first spreading layer 142 may be interposed between the first ohmic layer 132 and the first bump 152, and the first ohmic layer 132 may electrically connect the first spreading layer 142 to the first conductive semiconductor layer 122. As illustrated in the drawings, the first ohmic layer 132 may be in contact with the first conductive semiconductor layer 122.

The second ohmic layer 134A may be electrically connected to the second bump 154 through the second spreading layer 144. That is, the second ohmic layer 134A may be interposed between the plurality of second bumps 154 and the second conductive semiconductor layer 126. In addition, the second spreading layer 144 may be interposed between the second ohmic layer 134A and the plurality of second bumps 154, and the second ohmic layer 134A may electrically connect the second spreading layer 144 to the second conductive semiconductor layer 126. As illustrated in the drawings, the second ohmic layer 134A may be in contact with the second conductive semiconductor layer 126.

The first and second ohmic layers 132 and 134A may be formed of any material which may be grown in high quality from the first and second conductive semiconductor layers 122 and 126, respectively. For example, the first and second ohmic layers 132 and 134A may be formed of a metal such as Ag, Ni, Al, Rh, Pd, Ir, Ru, Mg, Zn, Pt, Au, Hf, or a selective composition thereof.

The first ohmic layer 132 may have an ohmic property and include a material in ohmic contact with the first conductive semiconductor layer 122. In addition, the second ohmic layer 134A may have an ohmic property and include a material in ohmic contact with the second conductive semiconductor layer 126.

Particularly, the second ohmic layer 134A may have at least one of a light-transmitting conductive material and a metal material. For example, the light-transmitting conductive material may be a transparent conductive oxide (TCO). For example, the light-transmitting conductive material may include at least one from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x/ITO$, $Ni/IrO_x/Au$, and $Ni/IrO_x/Au/ITO$, but is not limited thereto. In addition, the metal material may include at least one from aluminum (Al), gold (Au), and silver (Ag).

In addition, the second ohmic layer 134A may include a transparent electrode (not shown) and a reflective layer (not shown). The transparent electrode may be formed of the above-described light-transmitting conductive material, and the reflective layer may be formed of a metal material such as silver (Ag), but the embodiment is not limited thereto. The transparent electrode may be interposed between the reflective layer and the second conductive semiconductor layer 126, and the reflective layer may be disposed under the transparent electrode.

Meanwhile, the first spreading layer 142 may be interposed between the first ohmic layer 132 and the first bump 152. The second spreading layer 144 may be interposed between the second ohmic layer 134A and the plurality of second bumps 154. The first and second spreading layers 142 and 144 may serve a function for preventing degradation of electrical properties which can occur due to heat which is generated by the light emitting structure 120 and increases resistivity of the light emitting structure 120. To this end, the first and second spreading layers 142 and 144 may be formed of a high electrically conductive material.

In the case of the light emitting device 100A illustrated in FIG. 1, carriers are supplied to the light emitting structure 120 through the first and second bumps 152 and 154. Here, heat generated by the light emitting structure 120 may be radiated through the first and second bumps 152 and 154. As described above, since a path through which the carriers are supplied and a path through which heat is radiated are the same, a thermal degradation phenomenon, in which it is difficult for heat to radiate to the outside, may occur. Particularly, in a case in which light in a deep ultraviolet wavelength band has to be emitted by active layer 124, a heat loss rate may be further increased due to a high driving voltage.

To solve this, the light emitting device 100A according to the embodiment may further include a current blocking layer 190A. The current blocking layer 190A may be disposed in a maximum heating area (MHA) in the second ohmic layer 134A interposed between the second conductive semiconductor layer 126 and the second spreading layer 144. Here, the MHA may be a region in the light emitting structure 120 overlapping an area between the plurality of second bumps 154 in a thickness direction of the substrate 110 (hereinafter, referred to as a vertical direction).

In the embodiment, the MHA may be a region of the electrode layer (for example, the second ohmic layer 134A) which does not vertically overlap the plurality of second bumps 154.

The current blocking layer 190A may be disposed at the MHA of the second ohmic layer 134A such that the current blocking layer 190A does not cut the electrode layer (for example, the second ohmic layer 134A) in a direction (hereinafter, referred to as a horizontal direction) intersecting the vertical direction. Injection of carriers, which are injected into the electrode layer (for example, the second ohmic layer 134A), into the second conductive semiconductor layer 126 may be blocked from a region in which the current blocking layer 190A is disposed. That is, the current blocking layer 190A may serve a function for blocking current injection.

When a shortest distance T, which is illustrated in FIG. 2 and will be described below, is zero, the second ohmic layer 134A may be horizontally cut by the current blocking layer 190A. Accordingly, the shortest distance T may be greater than zero according to the embodiment.

Referring to FIG. 2 the second ohmic layer 134A may include a first region A1 and second regions A2.

The first region A1 in the second ohmic layer 134A is a region included in the MHA, and the second regions A2 may be regions horizontally adjacent to the first region A1, and may include second-first and second-second regions A21 and A22.

In addition, the current blocking layer 190A may include a first segment S1. The first segment S1 may be disposed in the first region A1 which is the MHA of the second ohmic layer 134A.

In addition, an upper surface of the current blocking layer 190A may be wider than a lower surface thereof. For example, referring to FIG. 2, a width WT of the upper surface (width of top) of the current blocking layer 190A may be wider than a width BT of the lower surface (width of bottom) thereof.

Figure 4:
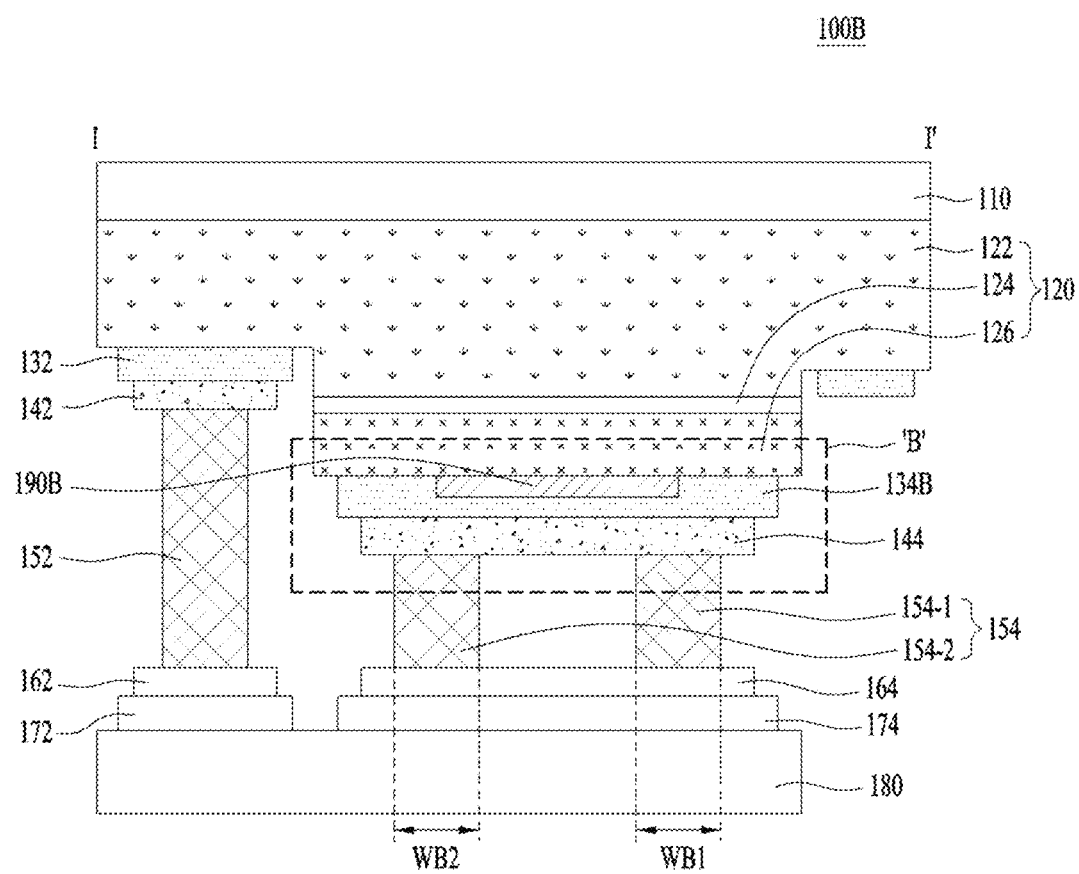
FIG. 4 is a cross-sectional view illustrating a light emitting device according to a second embodiment.
Figure 5:
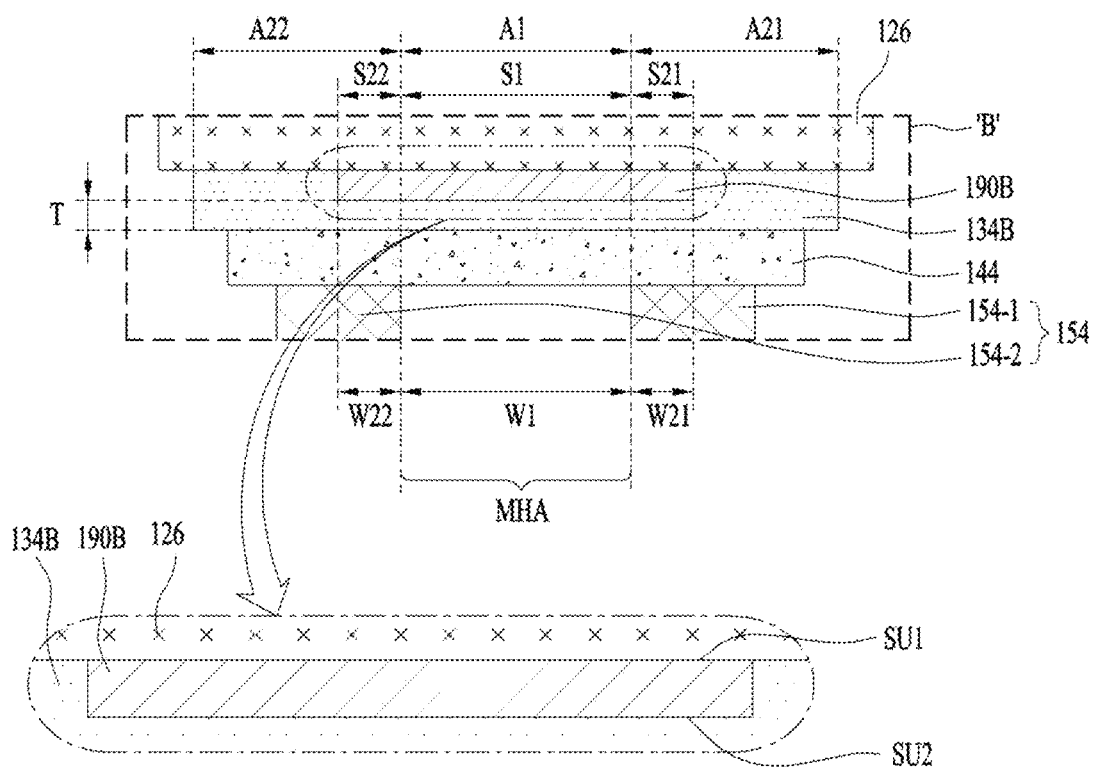
FIG. 5 is an enlarged cross-sectional view illustrating a portion 'B' illustrated in FIG. 4.

FIG. 4 is a cross-sectional view illustrating a light emitting device 100B according to a second embodiment, and FIG. 5 is an enlarged cross-sectional view illustrating a portion 'B' illustrated in FIG. 4.

Like the light emitting device 100A illustrated in FIG. 1, a light emitting device 100B illustrated in FIG. 4 corresponds to a cross-sectional view taken along line I-I' illustrated in FIG. 3, but the embodiment is not limited thereto. That is, the light emitting device 100B illustrated in FIG. 4 may also have various bottom views other than the bottom view illustrated in FIG. 3.

The light emitting device 100B illustrated in FIG. 4 may include a substrate 110, a light emitting structure 120, first and second ohmic layers 132 and 134B, first and second spreading layers 142 and 144, a first bump 152, a plurality of second bumps 154, first and second metal pads 162 and 164, first and second insulating layers 172 and 174, a submount 180, and a current blocking layer 190B.

Here, since the substrate 110, the light emitting structure 120, the first ohmic layer 132, the first and second spreading layers 142 and 144, the first bump 152, the plurality of second bumps 154, the first and second metal pads 162 and 164, the first and second insulating layers 172 and 174, and the submount 180 which are illustrated in FIG. 4 are the same as the substrate 110, the light emitting structure 120, the first ohmic layer 132, the first and second spreading layers 142 and 144, the first bump 152, the plurality of second bump 154, the first and second metal pads 162 and 164, the first and second insulating layers 172 and 174, and the submount 180, respectively, which are illustrated in FIG. 1, the same reference numbers thereof will be used, and the repeated descriptions will be omitted.

Unlike FIGS. 1 and 2, in the case of the light emitting device 100B illustrated in FIGS. 4 and 5, the current blocking layer 190B may also be disposed in a first region A1 of the second ohmic layer 134B, and may be disposed to extend from the first region A1 to second regions A2. That is, the current blocking layer 190B is disposed in an MHA, and may also be disposed to extend from the MHA to a region overlapping a plurality of second bumps 154-1 and 154-2 in a thickness direction. In this case, the layer 190B may further include second segments as well as a first segment S1. The second segments may include a second-first segment S21 and a second-second segment S22. The second-first and second-second segments S21 and S22 are portions horizontally extending from the first region A1 of the second ohmic layer 134B, in which the first segment S1 is disposed, to the second regions A21 and A22. The second-first and second-second segments S21 and S22 are portions vertically overlapping the second-first and second-second bumps 154-1 and 154-2, respectively.

As described above, in the light emitting device 100A illustrated in FIGS. 1 and 2, the current blocking layer 190A includes only the first segment S1, but in the light emitting device 100B illustrated in FIGS. 4 and 5, the current blocking layer 190B may further include the second-first and second-second segments S21 and S22 as well as the first segment S1. Except this, since the light emitting device 100B illustrated in FIGS. 4 and 5 is the same as the light emitting device 100A illustrated in FIGS. 1 and 2, the same reference numbers thereof will be used and the repeated descriptions will be omitted.

In the light emitting device 100A illustrated in FIG. 1, a horizontal width of the current blocking layer 190A is the same as a first width W1 of the first segment S1, that is, a width of the MHA. Here, the first width W1 may be in the range of 10 μm to 90 μm, for example, 75 μm, but the embodiment is not limited thereto. On the other hand, in the light emitting device 100B illustrated in FIG. 4, a horizontal width of the current blocking layer 190B may be a total sum of a first width W1 of the first segment S1 and second widths W21 and W22 of the second segments S21 and S22.

In a case in which the widths of the current blocking layers 190A and 190B respectively illustrated in FIGS. 1 and 4 are less than the widths of the MHAs, since currents are concentrated at the second ohmic layers 134A and 134B adjacent to the first and second bumps 152 and 154, the light emitting structure 120 and the second ohmic layers 134A and 134B may be broken down due to thermal degradation, and thus a lifetime of each of the light emitting devices 100A and 100B may be shortened and mechanical defects may occur. Accordingly, the total widths of the current blocking layers 190A and 190B may be greater than or equal to the widths of the MHAs.

The first width W1 of the first segment S1 of the current blocking layer 190B may be equal to the first width W1 of the first segment S1 of the above-described current blocking layer 190A.

In a case in which the second-first and second-second widths W21 and W22 of the current blocking layer 190B are greater than 25 μm, an area of an actual light emitting portion in which electrical recombination theoretically occurs in the active region and the second ohmic layer 134B, that is, a light emitting region of a light emitting device, may be decreased. Accordingly, density of a current flowing to the active layer 124 increases to increase an operating voltage.

In addition, in the case in which the second-first and second-second widths W21 and W22 are greater than 25 μm, experimentally, electric properties of the light emitting device 100B illustrated in FIG. 4 may be similar to those of the light emitting device 100A illustrated in FIG. 1. That is, in the case in which the second-first and second-second widths W21 and W22 are greater than 25 μm, variations in forward voltage ΔVf of the light emitting device 100B illustrated in FIG. 4 may be similar to that of the light emitting device 100A illustrated in FIG. 1.

In addition, when a production tolerance is considered, it may be difficult for the second-first and second-second widths W21 and W22 of the second-first and second-second segments S21 and S22 of the current blocking layer 190B to be smaller than 5 μm. Accordingly, the second-first and second-second widths W21 and W22 may range from 5 μm to 25 μm, and may preferably be 15 μm, but the embodiment is not limited thereto.

Each of the current blocking layers 190A and 190B of the above-described light emitting devices 100A and 100B respectively illustrated in FIGS. 2 and 4 may include a first surface SU1 and a second surface SU2. The first surface SU1 is defined as a surface in contact with the second conductive semiconductor layer 126, and the second surface SU2 is defined as a surface vertically facing the second spreading layer 144 and opposite side of the first surface SU1.

A shortest distance (hereinafter, referred to as a thickness T) from the second surface SU2 of the current blocking layers 190A and 190B to the second spreading layer 144 in a vertical direction may be changed according to a material forming the second ohmic layers 134A and 134B. Here, the shortest distance T may be a distance in which each of the current blocking layers 190A and 190B is vertically spaced apart from the second spreading layer 144, or may also be a thickness of each of the second ohmic layers 134A and 134B interposed between the current blocking layers 190A and 190B and the second spreading layer 144.

For example, in a case in which the second ohmic layers 134A and 134B include a light-transmitting conductive material, the shortest distance T from the second surface SU2 of each of the current blocking layers 190A and 190B to the second spreading layer 144 may range from 1 nm to 10 nm, but the embodiment is not limited thereto.

Alternatively, the second ohmic layers 134A and 134B include a metal material, a minimum value of the shortest distance T from the second surface SU2 of each of the current blocking layers 190A and 190B to the second spreading layer 144 may be 200 nm, but the embodiment is not limited thereto.

Figure 6:
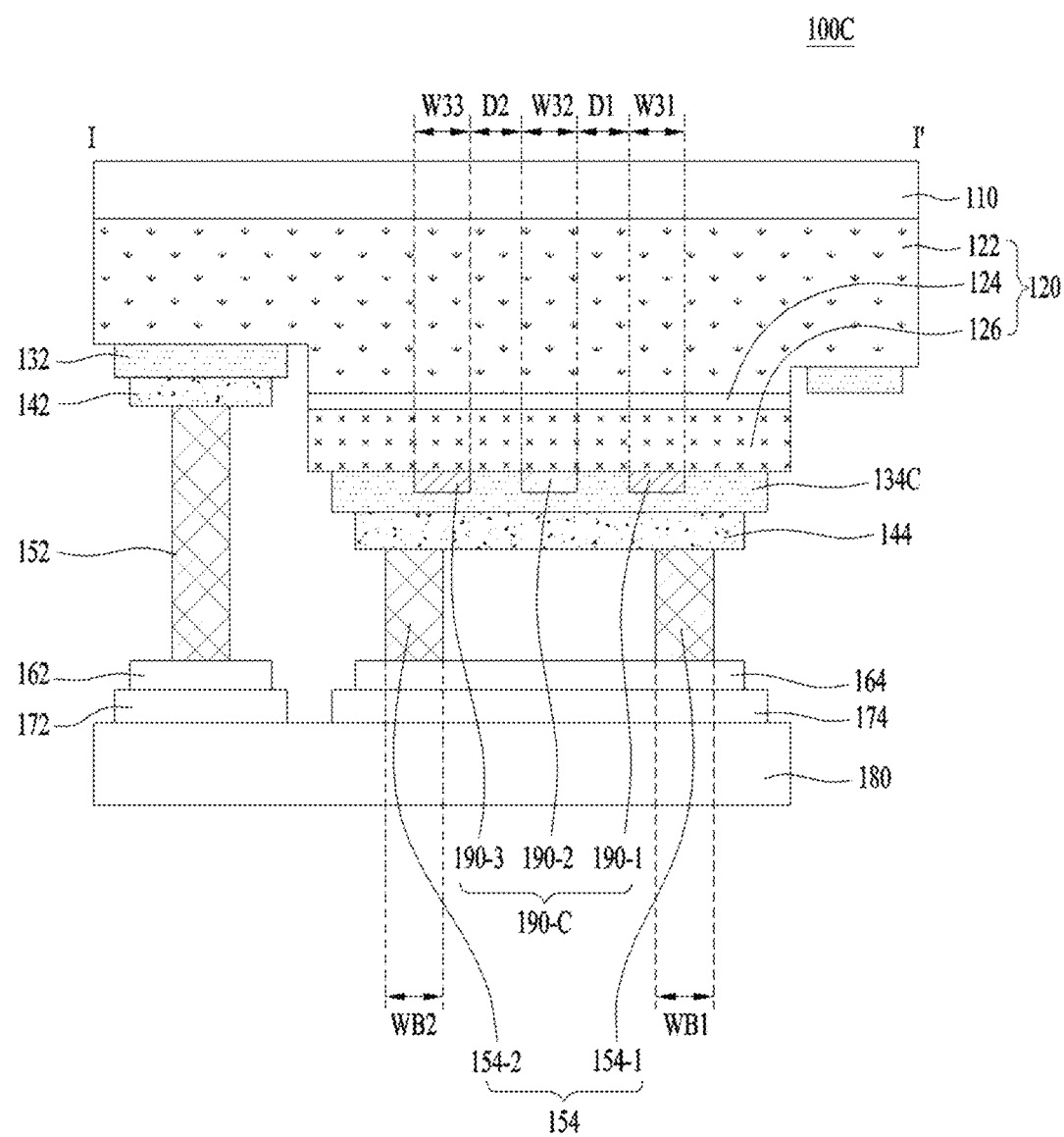
FIG. 6 is a cross-sectional view illustrating a light emitting device according to a third embodiment.

FIG. 6 is a cross-sectional view illustrating a light emitting device 100C according to a third embodiment.

Like the light emitting device 100A illustrated in FIG. 1, a light emitting device 100C illustrated in FIG. 6 corresponds to a cross-sectional view taken along line I-I' illustrated in FIG. 3, but the embodiment is not limited thereto. That is, the light emitting device 100C illustrated in FIG. 6 may also have various bottom views other than the bottom view illustrated in FIG. 3.

The light emitting device 100C illustrated in FIG. 6 may include a substrate 110, a light emitting structure 120, first and second ohmic layers 132 and 134C, first and second spreading layers 142 and 144, a first bump 152, a plurality of second bumps 154, first and second metal pads 162 and 164, first and second insulating layers 172 and 174, a submount 180, and a current blocking layer 190C.

Since the substrate 110, the light emitting structure 120, the first ohmic layer 132, the first and second spreading layers 142 and 144, the first bump 152, the plurality of second bumps 154, the first and second metal pads 162 and 164, the first and second insulating layers 172 and 174, and the submount 180 which are illustrated in FIG. 6 are the same as the substrate 110, the light emitting structure 120, the first ohmic layer 132, the first and second spreading layers 142 and 144, the first bump 152, the plurality of second bumps 154, the first and second metal pads 162 and 164, the first and second insulating layers 172 and 174, and the submount 180, respectively, which are illustrated in FIG. 1 or 4, the same reference numbers thereof will be used and the repeated descriptions will be omitted.

In the light emitting device 100A and 100B respectively illustrated in FIGS. 1 and 4, the number of each of the current blocking layers 190A and 190B disposed between the second-first bump 154-1 and the second-second bump 154-2 is one. However, in the light emitting device 100C, a plurality of current blocking layers 190C may be disposed between a second-first bump 154-1 and a second-second bump 154-2. For example, the current blocking layers 190C of the light emitting device 100C illustrated in FIG. 6 may include first, second, and third current blocking layers 190-1, 190-2, and 190-3. As described above, since the light emitting device 100C illustrated in FIG. 6 is the same as the light emitting device 100B illustrated in FIG. 4 except for a difference in number of the current blocking layers 190C, the repeated descriptions will be omitted.

In the case of FIG. 6, only three blocking layers, i.e., the first, second, and third current blocking layers 190-1, 190-2 and 190-3, are illustrated, but the embodiment is not limited thereto. That is, according to the third embodiment, the number of the current blocking layers 190C may be more than three or two.

In addition, vertical overlapping of each of the first and third current blocking layers 190-1 and 190-3 and of the second-first and second-second bumps 154 is the same as that of the second-first and second-second segments S21 and S22 of the current blocking layer 190B of the light emitting device 100B illustrated in FIG. 4.

In addition, the plurality of current blocking layers 190-1, 190-2 and 190-3 may be spaced an equidistance from each other in the second ohmic layer 134C. That is, a first distance D1 is referred to as a distance by which the first current blocking layer 190-1 is horizontally spaced apart from the second current blocking layer 190-2, and a second distance D2 is referred to as a distance by which the second current blocking layer 190-2 is horizontally spaced apart from the third current blocking layer 190-3. Here, the first distance D1 may be equal to the second distance D2. However, the embodiment is not limited thereto. That is, according to the second embodiment, the first and second distances D1 and D2 may also be different.

In addition, third-first, third-second, and third-third widths W31, W32, and W33 of the current blocking layers 190A, 190B, and 190C may be smaller than a width W1 of an MHA, but the embodiment is not limited thereto. In addition, the third-first, third-second, and third-third widths W31, W32, and W33 of the first, second, and third current blocking layers 190-1, 190-2 and 190-3 illustrated in FIG. 6 may also be equal or different.

Meanwhile, according to the embodiment, the current blocking layers 190A, 190B, and 190C may include air. Alternatively, the current blocking layers 190A, 190B, and 190C may also include a material in Schottky contact with the second conductive semiconductor layer 126. Alternatively, the current blocking layers 190A, 190B, and 190C may be formed due to phenomena such as surface defect and pinning of surface charge and Fermi-level due to plasma damage. In this case, the current blocking layers 190A, 190B, and 190C may include at least one from argon (Ar), fluorine (F), and oxygen (O) atoms. Alternatively, the current blocking layers 190A, 190B, and 190C may also include an insulating material such as an oxide or nitride.

In addition, in a case in which the current blocking layers 190A, 190B, and 190C are used as a dielectric, the electrostatic discharge (ESD) failure may be reduced.

However, the embodiment is not limited to the material of the above-described current blocking layers 190A, 190B, and 190C. That is, as long as the current blocking layers 190A, 190B, and 190C may have properties of blocking a current (or non-ohmic properties), the current blocking layers 190A, 190B, and 190C may include various materials.

Hereinafter, electrical and optical properties of light emitting devices according to comparative examples and the light emitting devices 100A, 100B, and 100C according to the embodiments will be described with reference to the accompanying drawings. In addition, in the following descriptions, the widths WB1 and WB2 of the second-first bump 152-1 and the second-second bump 152-2 are assumed to be 120 μm, but the embodiment is not limited thereto, and even in a case in which the widths WB1 and WB2 are smaller or greater than 120 μm, the following descriptions will be modified to be applied thereto.

Figure 7A:
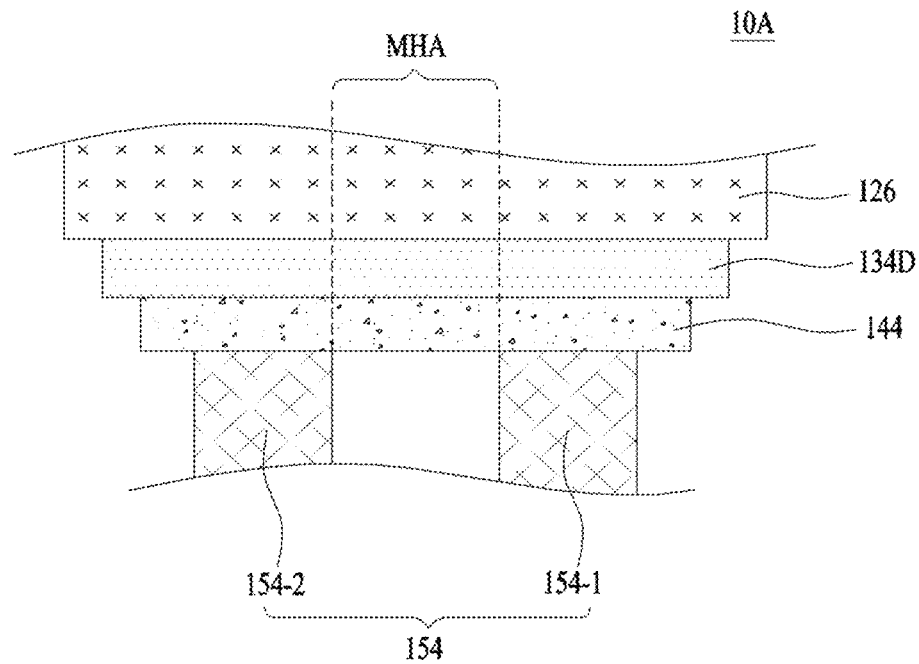
FIGS. 7A and 7B are cross-sectional views illustrating light emitting devices according to first and second comparative examples.
Figure 7B:
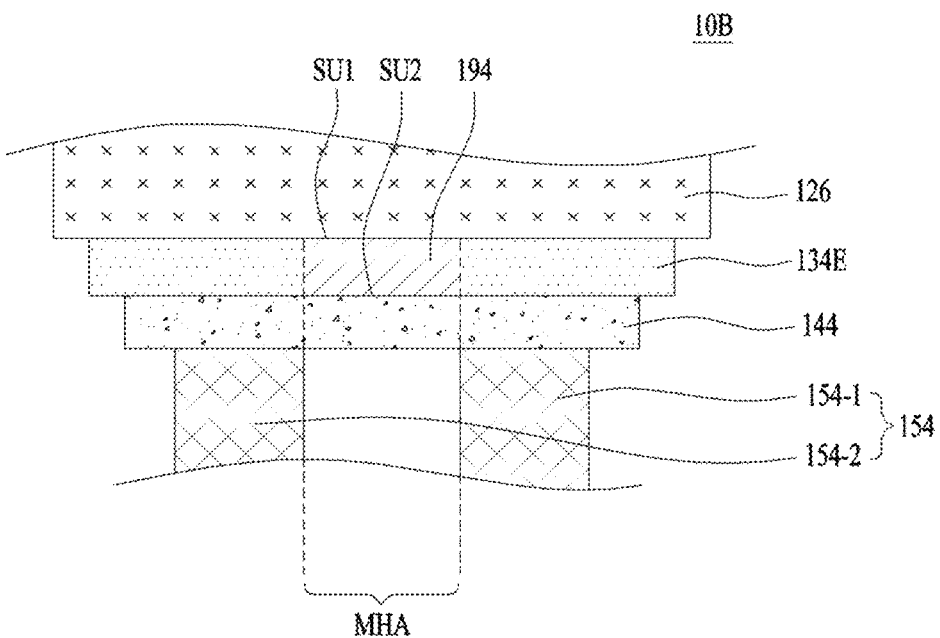

FIGS. 7A and 7B are cross-sectional views illustrating light emitting devices 10A and 10B according to first and second comparative examples. The first and second light emitting devices 10A and 10B according to the comparative examples illustrated in FIGS. 7A and 7B correspond to the portion 'A' illustrated in FIG. 2 (or the portion 'B' illustrated in FIG. 5).

In the first and second light emitting devices 10A and 10B according to the comparative examples illustrated in FIGS. 7A and 7B, the same reference numbers of portions, which are the same as those of the light emitting devices 100A and 100B, will be used, and the repeated descriptions thereof will be omitted. That is, the first and second light emitting devices 10A and 10B according to the comparative examples respectively illustrated in FIGS. 7A and 7B are the same as the light emitting devices 100A, 100B, and 100C according to the embodiments, respectively, except for a difference in structure of second ohmic layers 134D and 134E.

In the light emitting device 10A according to the first comparative example illustrated in FIG. 7A, the second ohmic layer 134D does not include the current blocking layers 190A, 190B, and 190C according to the embodiment.

In addition, in the light emitting device 10B according to the second comparative example illustrated in FIG. 7B, the second ohmic layer 134E includes a current blocking layer 194, and a second surface SU2 of the current blocking layer 194 is in contact with a second spreading layer 144, unlike the light emitting devices 100A, 100B, and 100C according to the embodiments. That is, a shortest distance T is 'zero'. In addition, unlike the current blocking layer 190B of the light emitting device 100B according to the embodiment, in the second ohmic layer 134E illustrated in FIG. 7B, a width of the current blocking layer 194 is equal to that of an MHA.

Figure 8:
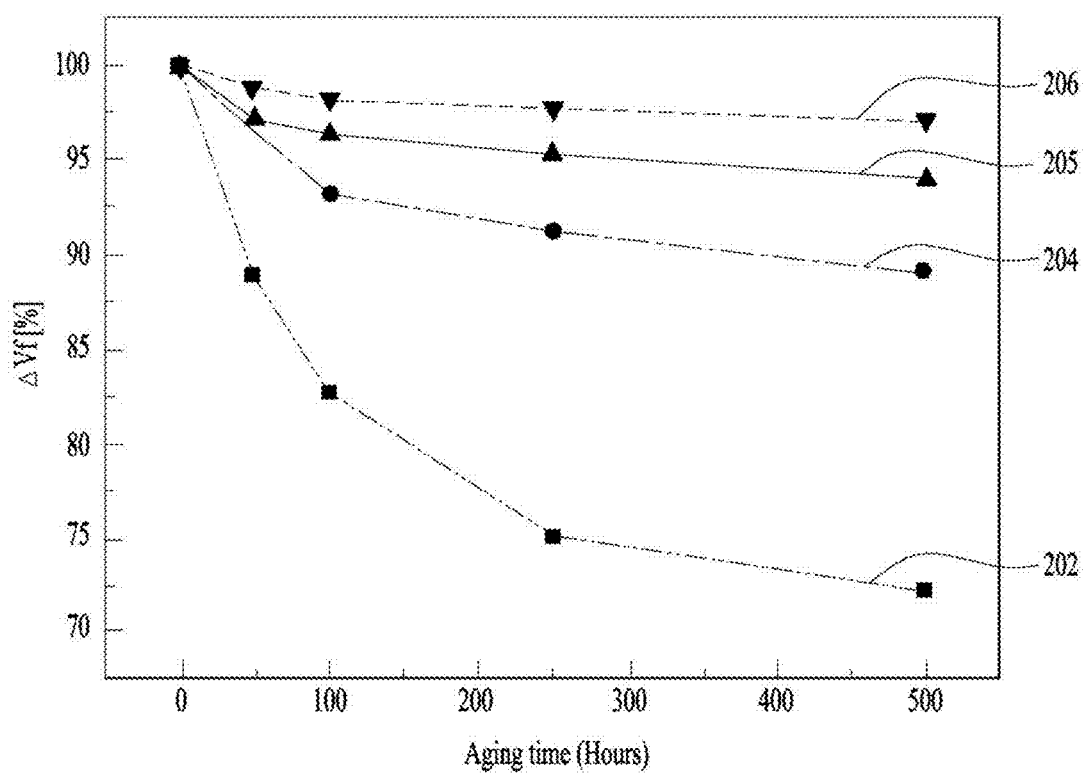
FIG. 8 is a graph of variations in forward voltage according to an aging time in light emitting devices according to the comparative examples and the embodiments.

FIG. 8 is a graph, according to an aging time, of variations in forward voltage of light emitting devices according to the comparative examples and the light emitting devices 100A and 100B according to the embodiments, wherein the horizontal axis denotes the aging time, and the vertical axis denotes variations in forward voltage (ΔVf) with a unit of percentage (%).

Generally, heat generated by each of the flip chip bonding type light emitting devices 10A, 10B, 100A, 100B, and 100C is mainly radiated through the second bumps 154. Here, in the light emitting devices 10A, 10B, 100A, 100B, and 100C, since the heat is not as easily radiated from a portion which is farther away from the second bumps 154, this may become a factor that degrades reliability.

In the case of the light emitting device 10A according to the first comparative example illustrated in FIG. 7A, since a current flows through the second bumps 154 (154-1 and 154-2) while heat is radiated, the heat radiation from the MHA in which the second ohmic layer 134D does not vertically overlap the second bumps 154 is not easy, and thus a thermal degradation phenomenon may occur. Accordingly, as illustrated in FIG. 8, the variations in forward voltage ΔVf of a graph 202 of the light emitting device 10A according to the first comparative example are largely changed according to an aging time. Particularly, when light in a deep ultraviolet wavelength band is emitted by the active layer, since thermal degradation of the second ohmic layer 134D occurs due to a high driving voltage of the light emitting device 10A, the variations in forward voltage ΔVf may be largely changed as illustrated in FIG. 8. In the case in which the variations in forward voltage ΔVf are largely changed according to the aging time as described above, an operating voltage may be decreased and a short failure may also occur, and thus a lifetime of the light emitting device 10A may be shortened.

On the other hand, as illustrated in FIG. 7B, in a case in which the light emitting device 10B includes the current blocking layer 194, variations in forward voltage ΔVf of a graph 204 are relatively improved from the variations in forward voltage ΔVf of the graph 202. That is, variations in forward voltage ΔVf between an initial value V0 of the operating voltage and an operating voltage V according to the aging time may be stable. This is because the current blocking layer 194 is disposed in the MHA to horizontally divide the first ohmic layer 134E into a plurality of first ohmic layers 134E such that heat of the light emitting device 10B is easily radiated. That is, the variations in forward voltage ΔVf of the graph 204 of the light emitting device 10B according to the second comparative example illustrated in FIG. 7B become less than the variations in forward voltage ΔVf of the graph 202 of the light emitting device 10A according to the first comparative example illustrated in FIG. 7A.

However, as illustrated in FIG. 7B, even when the current blocking layer 194 is formed, in a case in which the second surface SU2 of the current blocking layer 194 is in contact with the second spreading layer 144, since the second ohmic layer 134E is horizontally cut (or divided into two thereof) by the current blocking layer 194, it may be difficult for a current to uniformly flow to the cut second ohmic layer 134E.

On the other hand, as illustrated in FIG. 1, in a case in which the second surface SU2 of the current blocking layer 190A is formed to be vertically spaced apart from the second spreading layer 144, holes injected through the second spreading layer 144 may electrically uniformly flow to the second ohmic layer 134A. In addition, in a case in which the current blocking layer 190A is interposed between only the second conductive semiconductor layer 126 and the second ohmic layer 134A, there may be electrically advantageous. Accordingly, variations in forward voltage ΔVf of a graph 205 of the light emitting device 10A according to the first comparative example are less than the variations in forward voltage ΔVf of the graph 204 of the light emitting device 10B according to the second comparative example over time.

In addition, unlike the light emitting device 100A illustrated in FIG. 1, in a case in which the current blocking layer 190B illustrated in FIG. 4 further includes the second segments S21 and S22 to overlap the second-first and second-second bumps 154 or the current blocking layer 190C illustrated in FIG. 6 further includes the first and third current blocking layers 190-1 and 190-3, variations in forward voltage ΔVf of a graph 206 become less than the variations in forward voltage ΔVf of the graph 205 of the light emitting device 100A according to the first embodiment. The reasoning will be as follows.

Although heat mainly flows in the vertical direction in a case in which specific heat properties are different, in the case of a metal applied to light emitting devices, there may be almost no differences in specific heat property. That is, although heat generated by the second ohmic layers 134B and 134C mainly flows in the vertical direction, there is a horizontal heat spreading phenomenon. In consideration of the phenomenon, in the case in which the current blocking layer 190B further includes the second segments S21 and S22 as illustrated in FIG. 4, or the current blocking layer 190C further includes the first and third current blocking layers 190-1 and 190-3 as illustrated in FIG. 6, since a corrosion or oxidation phenomenon of a metal component due to heat does not occur, deformation of the ohmic layers 134B and 134C may be prevented.

Ultimately, as illustrated in FIG. 8, as the variations in forward voltage ΔVf decrease, a change in physical property such as an increase in resistance in the second conductive semiconductor layer 126 and the second ohmic layers 134A, 134B, and 134C which may be caused by current crowding or thermal crowding decreases. As a result, a lifetime of each of the light emitting devices 100A, 100B, and 100C may increase.

Figure 9:
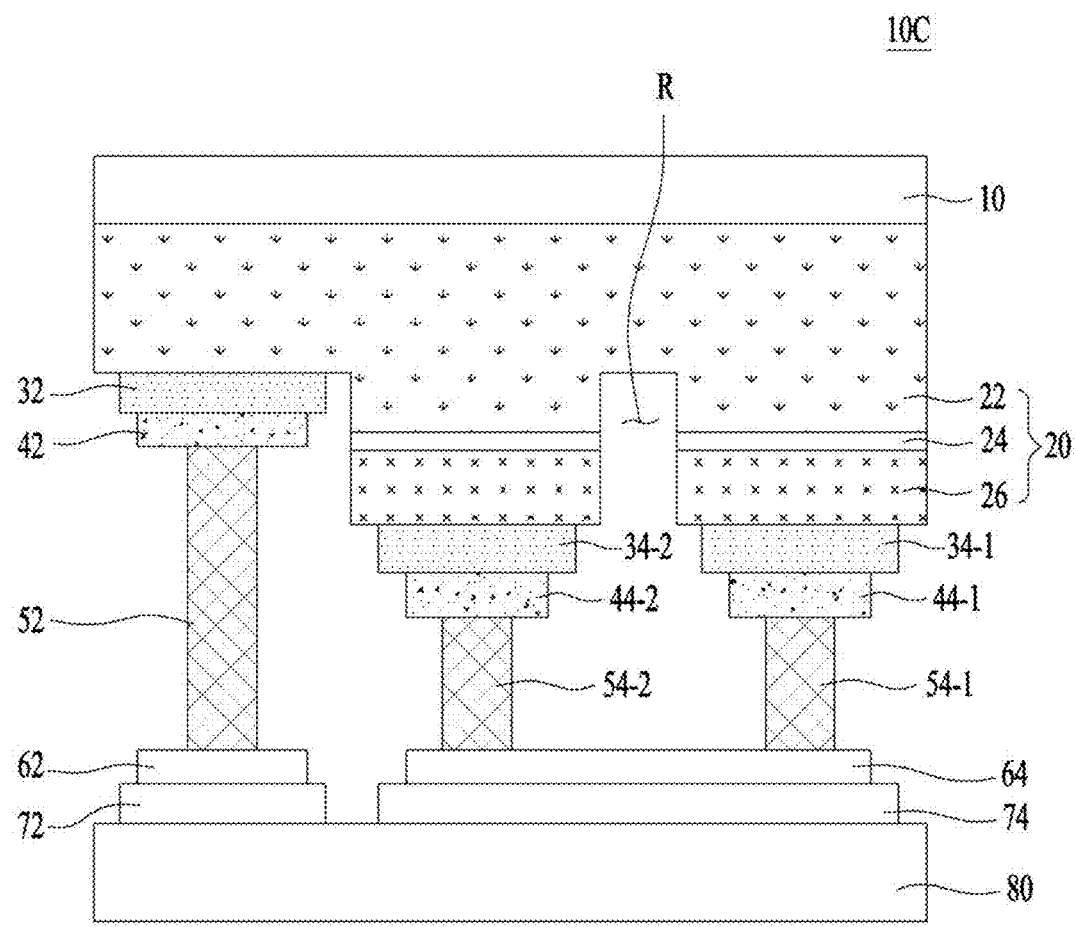
FIG. 9 is cross-sectional view illustrating a light emitting device according to a third comparative example.

FIG. 9 is cross-sectional view illustrating a light emitting device 10C according to a third comparative example.

The light emitting device 10C according to the third comparative example illustrated in FIG. 9 includes a substrate 10, a light emitting structure 20, a first ohmic layer 32, a second-first ohmic layer 34-1, a second-second ohmic layer 34-2, a first spreading layer 42, a second-first spreading layer 44-1, a second-second spreading layer 44-2, a first bump 52, a second-first bump 54-1, a second-second bump 54-2, a first metal pad 62, a second metal pad 64, a first insulating layer 72, a second insulating layer 74, and a submount 80. In addition, the light emitting structure 20 may include a first conductive semiconductor layer 22, an active layer 24, and a second conductive semiconductor layer 26.

Since the substrate 10, the light emitting structure 20, the first ohmic layer 32, the first spreading layer 42, the first bump 52, the second bump 54, the first metal pad 62, the second metal pad 64, the first insulating layer 72, the second insulating layer 74, and the submount 80 which are illustrated in FIG. 8 respectively correspond to the substrate 110, the light emitting structure 120, the first ohmic layer 132, the first spreading layer 142, the first bump 152, the second bump 54, the first metal pad 162, the second metal pad 164, the first insulating layer 172, the second insulating layer 174, and the submount 180 which are illustrated in FIG. 1, and serve the same functions as those thereof, and the repeated descriptions thereof will be omitted.

A difference between the light emitting device 100A illustrated in FIG. 1 and the light emitting device 10C according to the third comparative example illustrated in FIG. 9 will be described below.

In the case of the light emitting device 100A illustrated in FIG. 1, the current blocking layer 190A is disposed in the second ohmic layer 134A, but the second-first ohmic layer 34-1 and the second-second ohmic layer 34-2 are divided by a recess R formed by a mesa etching process in the light emitting device 10C according to the third comparative example illustrated in FIG. 9. In addition, in the case of the light emitting device 100A illustrated in FIG. 1, the second spreading layer 144 is not divided, but in the case of the light emitting device 10C illustrated in FIG. 8, the second-first spreading layer 44-1 and the second-second spreading layer 44-2 are divided by the recess R.

Figure 10A:
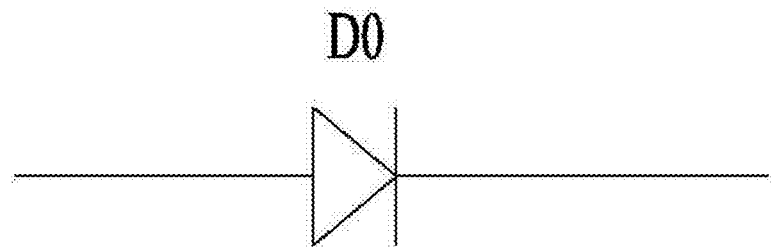
FIGS. 10A to 10C are views illustrating circuit diagrams of the light emitting devices according to the comparative examples and the embodiments.
Figure 10B:
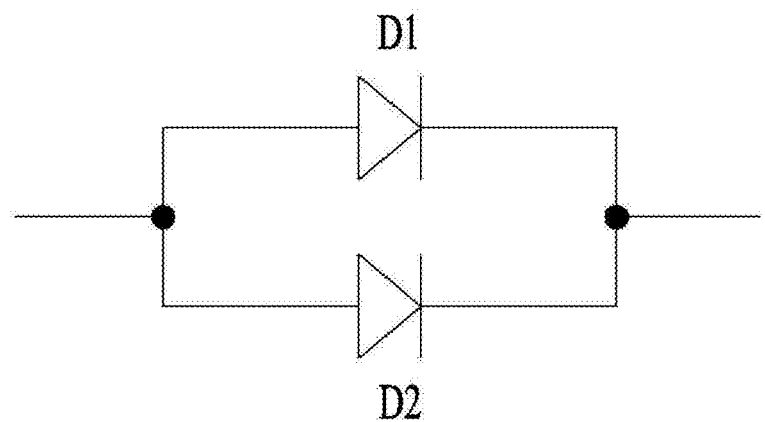
Figure 10C:
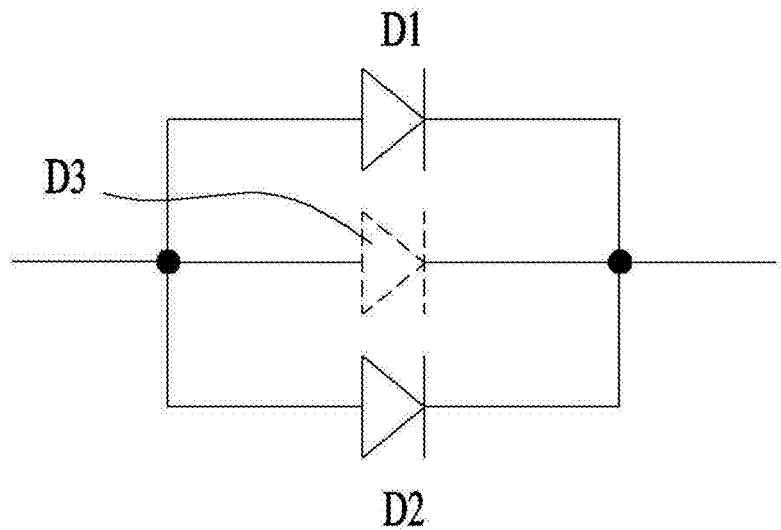

FIGS. 10A to 10C are views illustrating circuit diagrams of the light emitting devices according to the comparative examples and the embodiments.

When the light emitting device 10A does not include a current blocking layer as illustrated in FIG. 7A, the light emitting device 10A operates as one light emitting diode (LED) D0 as illustrated in FIG. 10A. In this case, since a path through which heat is radiated from the LED D0 and a path through which first conductive carriers are supplied are in the second bump 154, heat radiation may be difficult due to thermal degradation as illustrated above.

To solve the heat radiation, in a case in which the light emitting device 10C has a parallel structure as illustrated in FIG. 9, the light emitting device 10C serves as two LEDs D1 and D2 connected in parallel as illustrated in FIG. 10B. In this case, heat radiation may be improved from that of the light emitting device 10A according to the first comparative example illustrated in FIG. 7A, but an operating voltage has to be increased due to resistance of the LEDs D1 and D2. In addition, in order to equally make constant currents injected into the LEDs D1 and D2, surface resistances of the LEDs D1 and D2 present in the light emitting structure 20 have to be equal. Otherwise, in a case in which one of two LEDs D1 and D2 is broken, there is a problem in that an excessive current may be injected into the other LED and two LEDs D1 and D2 may then be sequentially broken. As described above, in the case of the light emitting device 10C according to the third comparative example illustrated in FIGS. 9 and 10B, power consumption may be increased, and current injection efficiency may be decreased as well as a circuit may be broken.

On the other hand, in the case of the light emitting devices 100A, 100B, and 100C according to the embodiments respectively illustrated in FIGS. 1, 4, and 6, since the current blocking layers 190A, 190B, and 190C are included therein, operations thereof as two LEDs D1 and D2 as illustrated in FIG. 10C are the same as that of the light emitting device 10C illustrated in FIG. 9. Here, in the light emitting devices 100A, 100B, and 100C according to the embodiments, even when surface resistances of the LEDs D1 and D2 present in the light emitting structure 120 are not equal, since the second spreading layer 144 is not divided, carriers may be injected through the second spreading layer 144. That is, the second spreading layer 144 may serve as a separate LED D3 illustrated in FIG. 10C. Accordingly, even when the above-described surface resistances are not equal, among the LEDs D1 and D2, an excessive current is not injected into an LED having a relatively low resistance, and when one diode is broken among two LEDs D1 and D2, the excessive current is injected into the remaining diodes, and thus a sequential break down phenomenon may not occur.

That is, in the case of the light emitting devices 100A, 100B, and 100C according to the embodiments illustrated in FIG. 10C, excessive current injection and sequential operation failure phenomena, which may occur at the light emitting device 10C having the parallel structure illustrated in FIG. 10B, may be prevented, and a difficulty in heat radiation from the light emitting device 10A illustrated in FIG. 10A may be reduced. Accordingly, since the light emitting devices 100A, 100B, and 100C according to the embodiments include a composite structure including a serial structure illustrated in FIG. 10A and the parallel structure illustrated in FIG. 10B, heat may be easily radiated, thermal degradation may be prevented, and thus reliability may be improved.

Figure 11:
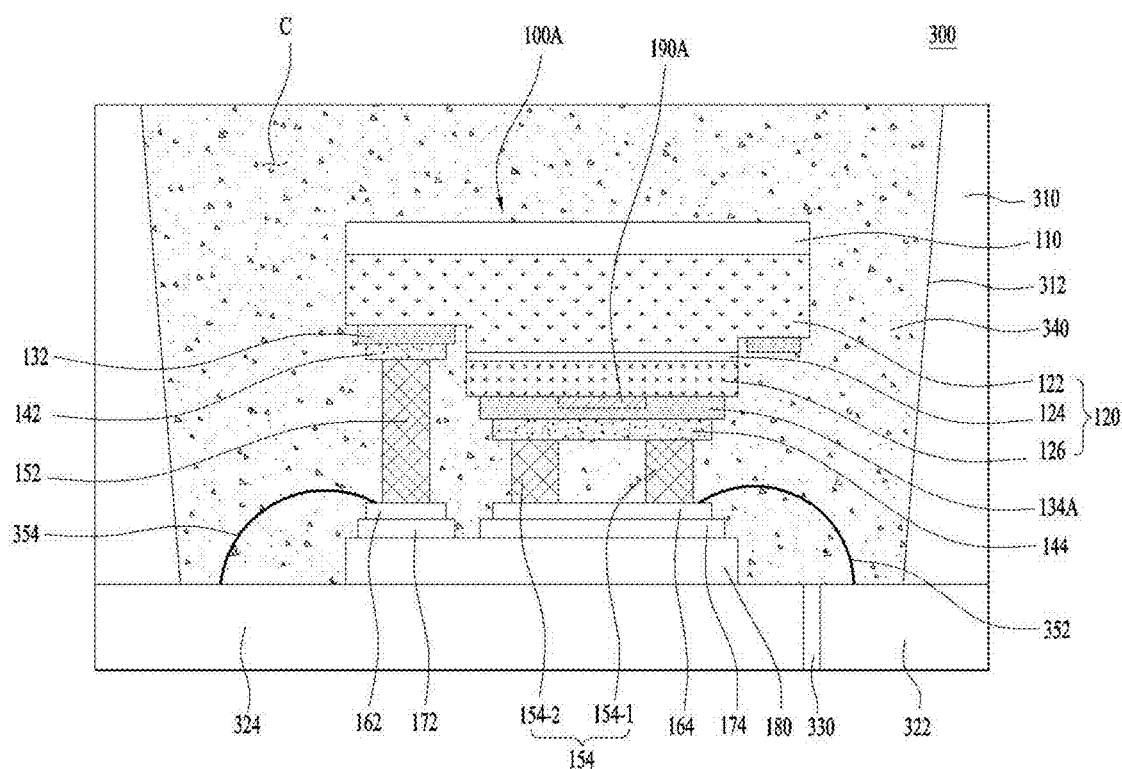
FIG. 11 is a cross-sectional view illustrating a light emitting device package according to the first embodiment.

FIG. 11 is a cross-sectional view illustrating a light emitting device package 300 according to the first embodiment.

Referring to FIG. 11, the light emitting device package 300 may include a light emitting device 100A, a package body 310, first and second lead frames 322 and 324, a third insulating layer 330, a molding member 340, first and second wires 352 and 354.

Here, although the light emitting device 100A corresponds to the light emitting device 100A illustrated in FIG. 1, the light emitting device 100B and 100C respectively illustrated in FIGS. 4 and 6 may be disposed in the package illustrated in FIG. 11 instead of the light emitting device 100A illustrated in FIG. 1.

The package body 310 illustrated in FIG. 11 may form a cavity C. For example, as illustrated in FIG. 11, the package body 310 and the first and second lead frames 322 and 324 may form the cavity C. That is, the cavity C may be formed by a side surface 312 and upper surfaces of the first and second lead frames 322 and 324 of the package body 310. However, the embodiment is not limited thereto. According to the second embodiment, unlike that illustrated in FIG. 11, the cavity C may also be formed by only the package body 310. Alternatively, a barrier wall (not shown) may also be disposed on the package body 310 having a flat upper surface, and the cavity may also be formed by the barrier wall and the upper surface of the package body 310. The package body 310 may be formed of an epoxy molding compound (EMC) and the like, but the embodiment is not limited to a material thereof. The light emitting device 100A may disposed in the cavity C.

The first and second lead frames 322 and 324 may be disposed to be horizontally spaced apart from each other. The first and second lead frames 322 and 324 may be formed of a conductive material such as a metal, but the embodiment is not limited to the kind of material thereof. To electrically separate the first and second lead frames 322 and 324, a third insulating layer 330 may also be interposed between the first and second lead frames 322 and 324.

In addition, in a case in which the package body 310 is formed of the conductive material such as the metal material, the first and second lead frames 322 and 324 may also be portions of the package body 310. Even in this case, the package body 310 forming the first and second lead frames 322 and 324 may be electrically separated by the third insulating layer 330.

In addition, first and second metal pads 162 and 164 connected to first and second conductive semiconductor layers 122 and 126 through the first and second bumps 152 and 154 may be respectively connected to the first and second lead frames 322 and 324 through the first and second wires 352 and 354.

Since the molding member 340 may be formed of, for example, silicon (Si) and may include a phosphor, the molding member 340 may change a wavelength of light emitted by the light emitting device 100A. The phosphor may include a fluorescent material which is one wavelength changing material among an yttrium aluminum garnet (YAG)-based phosphor, a terbium aluminum garnet (TAG)-based phosphor, a silicate-based phosphor, a sulfide-based phosphor, and a nitride-based phosphor capable of converting light generated by the light emitting device 100A into white light, but the embodiment is not limited to the kind of phosphor.

The YAG-based and TAG-based fluorescent materials may be selected from $(Y, Tb, Lu, Sc, La, Gd, or Sm)_3(Al, Ga, In, Si, or Fe)_5(O or S)_{12}:Ce$, and the silicate-based fluorescent material may be selected from $(Sr, Ba, Ca, or Mg)_2SiO_4:(Eu, F, or Cl)$.

In addition, the sulfide-based fluorescent material may be selected from $(Ca or Sr)S:Eu$, $(Sr,Ca, or Ba)(Al or Ga)_2S_4:Eu$, the nitride-based phosphor may be selected from phosphor components of $(Sr, Ca, Si, Al, or O)N:Eu$ (for example, $CaAlSiN_4:Eu$ $\beta$-SiAlON:Eu) or $(Ca_x or M_y)(Si or Al)_{12}(O or N)_{16}$ which is a Ca-α SiAlON:Eu-based phosphor ($0.05<x+y<0.3$, $0.02<x<0.27$ and $0.03<y<0.3$), wherein M is at least one material among Eu, Tb, Yb, and Er.

The nitride-based phosphor including N (for example, $CaAlSiN_3:Eu$) may be used as a red phosphor. The nitride-based red phosphor has higher reliability on an external environment such as heat and humidity and a lower discolor possibility than the sulfide-based phosphor.

A plurality of light emitting device packages according to the embodiment may be arrayed on a substrate, and a light guide plate, a prism sheet, a diffusing sheet, and the like, which are optical members, may be disposed on optical paths of the light emitting device packages. The light emitting device package, the substrate, and the optical members may serve as a backlight unit.

In addition, the light emitting device package according to the embodiment may be applied to a display device, an indicating device, and a lighting device.

Here, the display device may include a bottom cover, a reflective plate disposed on the bottom cover, a light emitting module configured to emit light, a light guide plate disposed in front of the reflective plate and configured to guide light, which is emitted by the light emitting module, in a forward direction, an optical sheet including prism sheets disposed in front of the light guide plate, a display panel disposed in front of the optical sheet, an image signal output circuit connected to the display panel and configured to supply an image signal to the display panel, and a color filter disposed in front of the display panel. Here, the bottom cover, the reflective plate, the light emitting module, the light guide plate, and the optical sheet may form the backlight unit.

In addition, the lighting device may include a light source module including the substrate and the light emitting device package according to the embodiment, a heat dissipation body configured to radiate heat of the light source module, and a power supplier configured to process or convert an electrical signal received from the outside and transmit the signal to the light source module. For example, the lighting device may include a lamp, a head lamp, and a street light.

The head lamp may include a light emitting module including the light emitting device packages disposed on the substrate, a reflector configured to reflect light emitted by the light emitting module in a predetermined direction, for example, a forward direction, a lens configured to refract the light reflected by the reflector in the forward direction, and a shade configured to generate a light distribution pattern, which is desired by a user, by blocking or reflecting a part of light reflected by the reflector and transmitted toward the lens.

While the embodiments have been mainly described, they are only examples but do not limit the present invention, and it may be known to those skilled in the art that various modifications and applications, which have not been described above, may be made without departing from the essential properties of the embodiments. For example, the specific components according to the embodiments may be modified. In addition, it will be interpreted that differences related to the modifications and applications fall within the scope of the present invention defined by the appended claims.

Modes for Performing the Invention

Modes for performing the present invention have been fully described through the above-described "Modes of the Invention."

INDUSTRIAL APPLICABILITY

A light emitting device according to the embodiments may be applied to a display device, an indicating device, and a lighting device such as a lamp, a head lamp, or a street light.

The invention claimed is:
1. A light emitting device comprising:
a substrate;
a light emitting structure disposed on the substrate and including a first conductive semiconductor layer, an active layer, and a second conductive semiconductor layer;
a first ohmic layer disposed on the first conductive semiconductor layer;
a second ohmic layer disposed on the second conductive semiconductor layer;
a first bump disposed on the first ohmic layer;
a plurality of second bumps disposed on the second ohmic layer to be spaced apart from each other; and
a current blocking layer interposed between the second ohmic layer and the second conductive semiconductor layer,
wherein the second ohmic layer includes a first region interposed between the plurality of second bumps, the current blocking layer is disposed on the first region to overlap the second ohmic layer in a horizontal direction and has a width smaller than that of the second ohmic layer, and
the horizontal direction intersects a thickness direction of the light emitting structure.
2. The semiconductor device of claim 1, wherein:
the first region overlaps an area interposed between the plurality of second bumps in the thickness direction of the light emitting structure; and
the second ohmic layer further includes
a second region adjacent to the first region in the horizontal direction intersecting the thickness direction of the light emitting structure.
3. The light emitting device of claim 2, wherein the current blocking layer is disposed to extend from the first region to the second region.
4. The light emitting device of claim 2, wherein the current blocking layer includes a first segment disposed in the first region.
5. The light emitting device of claim 4, wherein the current blocking layer further includes a second segment extending from the first segment to the second region and overlapping the plurality of second bumps in the thickness direction of the light emitting structure.
6. The light emitting device of claim 1, wherein
a width of the first segment ranges from 10 μm to 90 μm; and
a width of the second segment ranges from 5 μm to 25 μm.
7. The light emitting device of claim 1, wherein the current blocking layer includes air or a material in Schottky contact with the second conductive semiconductor layer.
8. The light emitting device of claim 1, wherein the current blocking layer includes an insulating material.
9. The light emitting device of claim 1, wherein the active layer emits light in a deep ultraviolet wavelength band.
10. The light emitting device of claim 1, wherein the current blocking layer includes a plurality of current blocking layers which have portions overlapping the plurality of second bumps in the thickness direction of the light emitting structure and are disposed in the horizontal direction.
11. The light emitting device of claim 10, wherein the plurality of current blocking layers are disposed to be spaced apart from each other.
12. The light emitting device of claim 1, further comprising:
a submount disposed to face the substrate;
first and second metal pads disposed on the submount to be spaced apart from each other;
a first spreading layer interposed between the first ohmic layer and the first bump; and
a second spreading layer interposed between the second ohmic layer and the plurality of second bumps.
13. The semiconductor device of claim 12, wherein the current blocking layer includes:
a first surface in contact with the second conductive semiconductor layer; and
a second surface facing the second spreading layer in the thickness direction of the light emitting structure and disposed to be opposite the first surface.
14. The light emitting device of claim 13, wherein:
the second ohmic layer includes a light-transmitting conductive material; and
a shortest distance from the second surface of the current blocking layer to the second spreading layer ranges from 1 nm to 10 nm.

15. The light emitting device of claim 13, wherein:
the second ohmic layer includes a metal material; and
a shortest distance from the second surface of the current blocking layer to the second spreading layer is 200 nm or more.

16. A light emitting device comprising:
a substrate;
a light emitting structure disposed on the substrate and including a first conductive semiconductor layer, an active layer, and a second conductive semiconductor layer;
an electrode layer disposed on the light emitting structure;
a plurality of bumps disposed on the electrode layer; and
a current blocking layer which is disposed in a region between the plurality of bumps to overlap the electrode layer in a horizontal direction and has a width smaller than that of the electrode layer.

17. The light emitting device of claim 16, wherein:
the electrode layer includes
an ohmic layer interposed between the light emitting structure and the plurality of bumps; and
a spreading layer interposed between the ohmic layer and the plurality of bumps,
wherein the current blocking layer is disposed in the ohmic layer.

18. The light emitting device of claim 17, wherein the light emitting structure includes:
a first conductive semiconductor layer disposed under the substrate;
an active layer disposed under the first conductive semiconductor layer; and
a second conductive semiconductor layer disposed under the active layer.

19. The light emitting device of claim 18, wherein:
the ohmic layer includes first and second ohmic layers;
the spreading layer includes first and second spreading layers;
the plurality of metal pads include first and second metal pads;
the plurality of bumps include a first bump interposed between the first spreading layer and the first metal pad, and a plurality of second bumps interposed between the second spreading layer and the second metal pad; and
the current blocking layer horizontally extends to a region overlapping the plurality of second bumps in a thickness direction of the light emitting structure.

* * * * *